(12) United States Patent
Yang

(10) Patent No.: US 10,775,925 B2
(45) Date of Patent: Sep. 15, 2020

(54) SHIFT REGISTER UNIT AND METHOD FOR DRIVING THE SAME, GATE DRIVING CIRCUIT AND DISPLAY APPARATUS

(71) Applicants: HEFEI XINSHENG OPTOELECTRONICS TECHNOLOGY CO., LTD., Hefei, Anhui (CN); BOE TECHNOLOGY GROUP CO., LTD., Beijing (CN)

(72) Inventor: Tong Yang, Beijing (CN)

(73) Assignees: HEFEI XINSHENG OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/374,744

(22) Filed: Apr. 3, 2019

(65) Prior Publication Data

US 2020/0042153 A1 Feb. 6, 2020

(30) Foreign Application Priority Data

Aug. 6, 2018 (CN) .......................... 2018 1 0884535

(51) Int. Cl.
*G06F 3/041* (2006.01)
*G09G 3/20* (2006.01)
*G11C 19/28* (2006.01)

(52) U.S. Cl.
CPC ........ *G06F 3/04166* (2019.05); *G06F 3/0412* (2013.01); *G09G 3/20* (2013.01); *G11C 19/28* (2013.01); *G09G 2300/0426* (2013.01); *G09G 2310/0267* (2013.01); *G09G 2310/0286* (2013.01)

(58) Field of Classification Search
CPC ........ G06F 3/04166; G09G 2310/0267; G09G 2310/0286; G09G 3/20; G09G 2300/0426; G11C 19/28
See application file for complete search history.

(56) References Cited

U.S. PATENT DOCUMENTS

| 2017/0108989 A1* | 4/2017 | Gu | ........................ G06F 3/0418 |
| 2017/0199617 A1* | 7/2017 | Gu | ........................ G06F 3/0416 |
| 2018/0204521 A1* | 7/2018 | Gu | ........................ G09G 3/3266 |
| 2019/0129560 A1* | 5/2019 | Li | ........................ G09G 3/3677 |

FOREIGN PATENT DOCUMENTS

CN 105185343 A 12/2015

\* cited by examiner

*Primary Examiner* — Alexander Eisen
*Assistant Examiner* — Nathaniel P Brittingham
(74) *Attorney, Agent, or Firm* — Kinney & Lange, P.A.

(57) ABSTRACT

A shift register unit and a method for driving the same, a gate driving circuit, and a touch display apparatus are disclosed. The shift register unit includes: an input circuit configured to output an input signal received at an input signal terminal to a pull-up node; an output circuit configured to output a gate driving signal at an output signal terminal under control of a clock signal; a reset circuit configured to reset the pull-up node to a first level under control of a reset signal; a pull-down control circuit configured to control a level at the output signal terminal using the first level at a first level terminal under control of a control signal and the level at the pull-up node; and a compensation circuit configured to compensate for the level at the pull-up node using a compensation signal under control of the level at the pull-up node.

13 Claims, 10 Drawing Sheets

SHIFT REGISTER UNIT AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201810884535.8, filed on Aug. 6, 2018, which is incorporated herein by reference in its entirety.

TECHNICAL FIELD

The present disclosure relates to the field of display, and more particularly, to a shift register unit and a method for driving the same, a gate driving circuit, and a touch display apparatus.

BACKGROUND

In a Thin Film Transistor (TFT)-based display apparatus, a gate driving circuit for driving a gate may be formed on a display panel to form a Gate drive On Array (GOA) panel. The gate driving circuit may comprise a plurality of cascaded shift register units. In a conventional gate driving circuit, an output signal of a next stage of shift register unit is usually used as a reset signal of a current stage of shift register unit, and an output signal of a previous stage of shift register unit is usually used as an input signal of the current stage of shift register unit. An operation of a touch display apparatus, as one of display apparatuses, may comprise a display phase and a touch phase. In the touch phase, shift register units are required to have no gate driving signal output to perform row touch scanning. In the display phase, the shift register units perform normal display driving scanning. In a normal operation of the touch display apparatus, control is required to be performed in the touch phase and the display phase to achieve desired stable signal output.

SUMMARY

Embodiments of the present disclosure provide a shift register unit and a method for driving the same, a gate driving circuit, and a touch display apparatus.

According to an aspect of the embodiments of the present disclosure, there is provided a shift register unit, comprising:

an input circuit electrically connected to an input signal terminal and a pull-up node of the shift register unit, and configured to output an input signal received at the input signal terminal to the pull-up node;

an output circuit electrically connected to an output signal terminal and a clock signal terminal, and configured to output a gate driving signal at the output signal terminal under control of a clock signal received at the clock signal terminal;

a reset circuit electrically connected to a reset signal terminal, the pull-up node and a first level terminal, and configured to reset the pull-up node to a first level at the first level terminal under control of a reset signal received at the reset signal terminal;

a pull-down control circuit electrically connected to a control signal terminal, the pull-up node, the first level terminal and the output signal terminal, and configured to control a level at the output signal terminal using the first level at the first level terminal under control of a control signal received at the control signal terminal and a level at the pull-up node; and a compensation circuit electrically connected to a compensation signal terminal and the pull-up node, and configured to compensate for the level at the pull-up node using a compensation signal received at the compensation signal terminal under control of the level at the pull-up node.

In an example, the compensation circuit comprises a first transistor, a second transistor, and a first capacitor, wherein a control electrode of the first transistor is electrically connected to a first terminal of the first capacitor, a first electrode of the first transistor is electrically connected to the compensation signal terminal, a second electrode of the first transistor is electrically connected to a control electrode and a first electrode of the second transistor; and a second electrode of the second transistor and a second terminal of the first capacitor are electrically connected to the pull-up node.

In an example, the pull-down control circuit comprises a first sub-circuit and a second sub-circuit, wherein the first sub-circuit is electrically connected to the control signal terminal, the pull-up node and a pull-down node, and is configured to control a level at the pull-down node under control of the control signal and the level at the pull-up node; and the second sub-circuit is electrically connected to the first level terminal, the pull-down node, and the output signal terminal, and is configured to pull down the level at the output signal terminal using the first level under control of the level at the pull-down node.

In an example, the first sub-circuit comprises a third transistor, a fourth transistor, a fifth transistor, and a sixth transistor, wherein a control electrode and a first electrode of the third transistor are commonly electrically connected to the control signal terminal, and a second electrode of the third transistor is electrically connected to a control electrode of the fourth transistor; a first electrode of the fourth transistor is electrically connected to the control signal terminal, and a second electrode of the fourth transistor is electrically connected to the pull-down node; a control electrode of the fifth transistor is electrically connected to the pull-up node, a first electrode of the fifth transistor is electrically connected to the first level terminal, and a second electrode of the fifth transistor is electrically connected to the control electrode of the fourth transistor; and a control electrode of the sixth transistor is electrically connected to the pull-up node, a first electrode of the sixth transistor is electrically connected to the first level terminal, and a second electrode of the sixth transistor is electrically connected to the second electrode of the fourth transistor.

In an example, the second sub-circuit comprises a seventh transistor and a ninth transistor, wherein a control electrode of the seventh transistor is electrically connected to the pull-down node, a first electrode of the seventh transistor is electrically connected to the first level terminal, and a second electrode of the seventh transistor is electrically connected to the pull-up node; and a control electrode of the ninth transistor is electrically connected to the pull-down node, a first electrode of the ninth transistor is electrically connected to the first level terminal, and a second electrode of the ninth transistor is electrically connected to the output signal terminal.

In an example, the second sub-circuit further comprises an eighth transistor, wherein a control electrode of the eighth transistor is electrically connected to the pull-down node, a first electrode of the eighth transistor is electrically connected to the first level terminal, and a second electrode of the eighth transistor is electrically connected to a second output signal terminal.

In an example, the output circuit comprises a tenth transistor and a second capacitor, wherein a control electrode of the tenth transistor is electrically connected to the pull-up node, a first electrode of the tenth transistor is electrically connected to the clock signal terminal, and a second electrode of the tenth transistor is electrically connected to the output signal terminal; and a first terminal of the second capacitor is electrically connected to the pull-up node, and a second terminal of the second capacitor is electrically connected to the output signal terminal.

In an example, the output circuit further comprises an eleventh transistor, wherein a control electrode of the eleventh transistor is electrically connected to the pull-up node, a first electrode of the eleventh transistor is electrically connected to the clock signal terminal, and a second electrode of the eleventh transistor is electrically connected to a second output signal terminal.

According to another aspect of the embodiments of the present disclosure, there is provided a gate driving circuit, comprising:

a compensation signal line; and a plurality of cascaded shift register units according to the embodiments of the present disclosure, wherein the compensation signal line is electrically connected to a compensation signal terminal of each of the plurality of shift register units.

According to yet another aspect of the embodiments of the present disclosure, there is provided a touch display apparatus, comprising the gate driving circuit according to the embodiments of the present disclosure.

According to a further aspect of the embodiments of the present disclosure, there is provided a method for driving the shift register unit according to the embodiments of the present disclosure, comprising:

providing, in a first period, an input signal having a second level, so that a level at the pull-up node is raised up;

providing, in a second period, a clock signal having the second level, so that the level at the pull-up node continuously rises, and the output signal terminal of the shift register unit outputs a gate driving signal;

providing, in a third period, a reset signal having the second level to reset a level at the output signal terminal and the level at the pull-up node; and de-noising, in a fourth period, the output signal terminal and the pull-up node under control of a level at a pull-down node, wherein the method further comprises: compensating for, in a touch period, the level at the pull-up node using the compensation signal under control of the level at the pull-up node.

In an example, the compensation signal has the second level.

In an example, the touch period is after the first period and before the second period, or the touch period is after the second period and before the third period.

BRIEF DESCRIPTION OF THE ACCOMPANYING DRAWINGS

DETAILED DESCRIPTION

Figure 1:
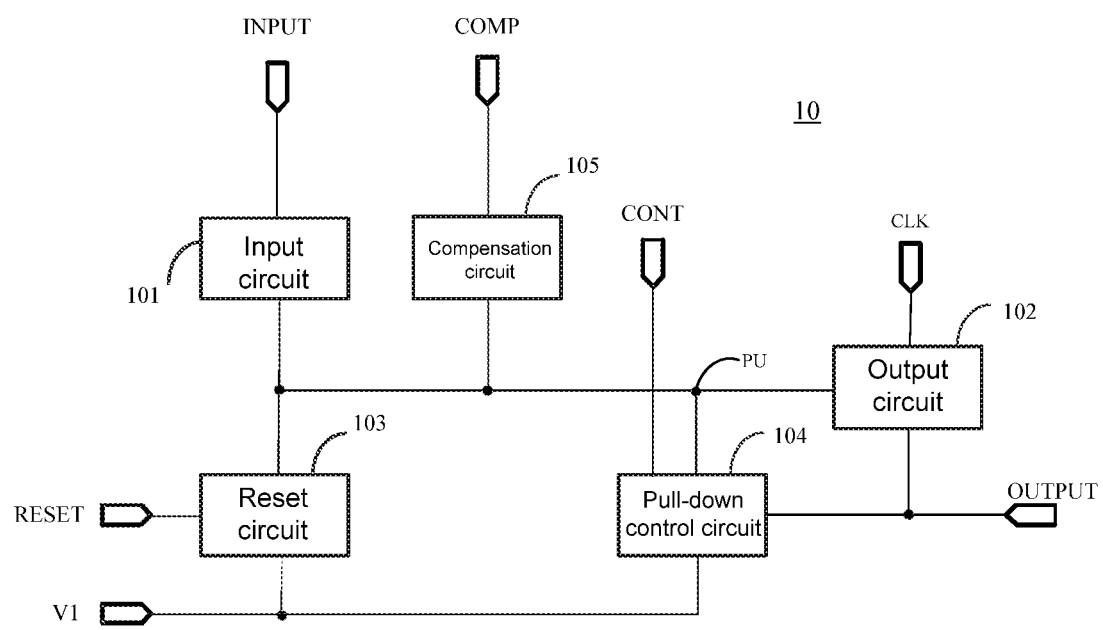
FIG. 1 illustrates an exemplary circuit diagram of a shift register unit according to an embodiment of the present disclosure.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or configuration will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "connected" or "connected to" may mean that two components are directly connected, or that two components are connected via one or more other components. In addition, the two components can be connected or coupled by wire or wirelessly.

In addition, in the description of the embodiments of the present disclosure, the terms "first level" and "second level" are only used to distinguish magnitudes of the two levels from each other. For example, the following description is made by taking the "first level" being a low level and the "second level" being a high level as an example. It can be understood by those skilled in the art that the present disclosure is not limited thereto.

The transistors used in the embodiments of the present disclosure may each be a thin film transistor or a field effect transistor or other devices having the same characteristics. In some embodiments, the thin film transistor used in the embodiments of the present disclosure may be an oxide semiconductor transistor. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following examples, the description is made by taking an N-type thin film transistor as an example. It can be understood by those skilled in the art that the embodiments of the present disclosure may obviously applied to a case of a P-type thin film transistor.

Embodiments of the present disclosure provide a shift register unit. FIG. 1 illustrates a schematic block diagram of a shift register unit 10 according to an embodiment of the present disclosure.

As shown in FIG. 1, the shift register unit 10 according to the embodiment of the present disclosure may comprise an input circuit 101. The input circuit 101 may be electrically connected to an input signal terminal INPUT and a pull-up node PU of the shift register unit 10. The input circuit 101 is configured to output an input signal Input received at the input signal terminal INPUT to the pull-up node PU.

The shift register unit 10 may further comprise an output circuit 102. The output circuit 102 is electrically connected to an output signal terminal OUTPUT and a clock signal terminal CLK. The output circuit 102 is configured to output a gate driving signal at the output signal terminal OUTPUT under control of a clock signal Clk received at the clock signal terminal CLK.

The shift register unit 10 may further comprise a reset circuit 103. The reset circuit 103 is electrically connected to a reset signal terminal RESET, the pull-up node PU, and a first level terminal V1. The reset circuit 103 is configured to reset the pull-up node PU to a first level v1 at the first level terminal V1 under control of a reset signal Reset received at the reset signal terminal RESET.

The shift register unit 10 may further comprise a pull-down control circuit 104. The pull-down control circuit 104 is electrically connected to a control signal terminal CONT, the pull-up node PU, and the output signal terminal OUTPUT. The pull-down control circuit 104 is configured to control a level at the output signal terminal OUTPUT under control of a control signal Cont received at the control signal terminal CONT and the level at the pull-up node PU.

The shift register unit 10 may further comprise a compensation circuit 105. The compensation circuit 105 is electrically connected to a compensation signal terminal COMP and the pull-up node PU. The compensation circuit 105 is configured to compensate for the level at the pull-up node PU using a compensation signal Comp received at the compensation signal terminal COMP under control of the level at the pull-up node PU.

Figure 2:
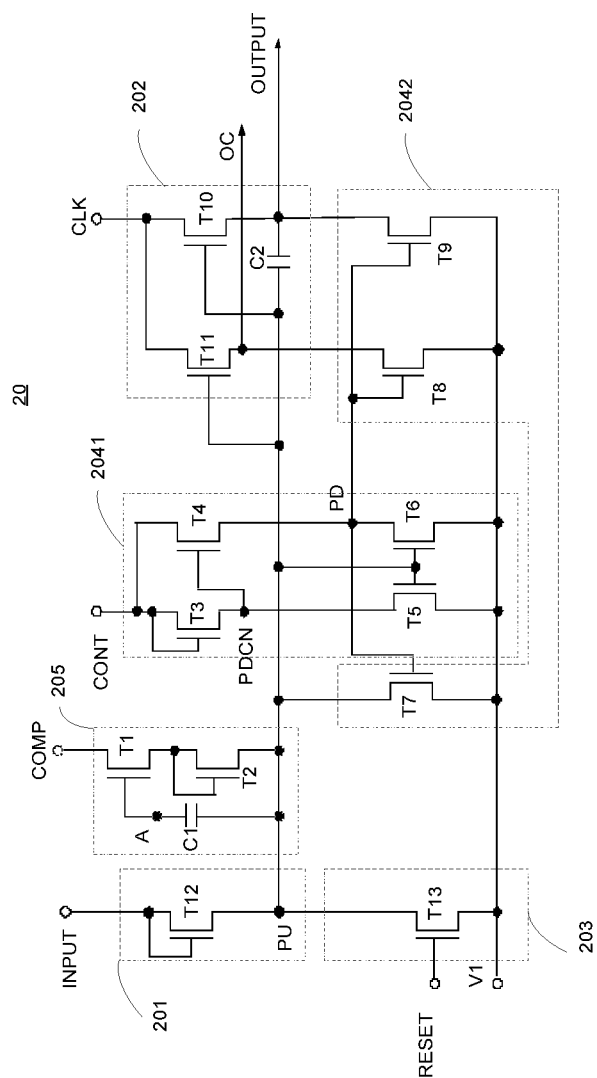
FIG. 2 illustrates an exemplary circuit diagram of a shift register unit according to an embodiment of the present disclosure.

FIG. 2 illustrates an exemplary circuit diagram of a shift register unit according to an embodiment of the present disclosure. As shown in FIG. 2, in the shift register unit 20 according to the embodiment of the present disclosure, a compensation circuit 205 may comprise a first transistor T1, a second transistor T2, and a first capacitor C1. A control electrode of the first transistor T1 is electrically connected to a first terminal of the first capacitor C1, a first electrode of the first transistor T1 is electrically connected to a compensation signal terminal COMP, and a second electrode of the first transistor T1 is electrically connected to a control electrode and a first electrode of the second transistor T2. A second electrode of the second transistor T2 and a second terminal of the first capacitor C1 are electrically connected to a pull-up node PU.

As shown in FIG. 2, a pull-down control circuit 204 may comprise a first sub-circuit 2041 and a second sub-circuit 2042. The first sub-circuit 2041 is electrically connected to a control signal terminal CONT, the pull-up node PU, and a pull-down node PD. The first sub-circuit 2041 is configured to control a level at the pull-down node PD and a level at a node PDCN under control of a control signal and a level at the pull-up node. The second sub-circuit 2042 is electrically connected to the pull-up node PD, the pull-down node PD, an output signal terminal OUTPUT, a second output signal terminal OC, and a first level terminal V1. The second sub-circuit 2042 is configured to pull down a level at the output signal terminal OUTPUT, a level at the second output signal terminal OC and the level at the pull-up node PU using a first level under control of the level at the pull-down node PD.

As shown in FIG. 2, the first sub-circuit 2041 may comprise a third transistor T3, a fourth transistor T4, a fifth transistor T5, and a sixth transistor T6. A control electrode and a first electrode of the third transistor T3 are electrically connected to the control signal terminal CONT, and a second electrode of the third transistor T3 is electrically connected to a control electrode of the fourth transistor T4 at the node PDCN. A first electrode of the fourth transistor T4 is electrically connected to the control signal terminal, and a second electrode of the fourth transistor T4 is electrically connected to the pull-down node PD. A control electrode of the fifth transistor T5 is electrically connected to the pull-up node PU, a first electrode of the fifth transistor T5 is electrically connected to the first level terminal V1, and a second electrode of the fifth transistor T5 is electrically connected to the control electrode of the fourth transistor T4. A control electrode of the sixth transistor T6 is electrically connected to the pull-up node, a first electrode of the sixth transistor T6 is electrically connected to the first level terminal, and a second electrode of the sixth transistor T6 is electrically connected to the second electrode of the fourth transistor T4. The second sub-circuit 2042 may comprise a seventh transistor T7, an eighth transistor T8, and a ninth transistor T9. A control electrode of the seventh transistor T7 is electrically connected to the pull-down node PD, a first electrode of the seventh transistor T7 is electrically connected to the first level terminal V1, and a second electrode of the seventh transistor T7 is electrically connected to the pull-up node PU. A control electrode of the eighth transistor T8 is electrically connected to the pull-down node PD, a first electrode of the eighth transistor T8 is electrically connected to the first level terminal V1, and a second electrode of the eighth transistor T8 is electrically connected to the second output signal terminal OC. A control electrode of the ninth transistor T9 is electrically connected to the pull-down node PD, a first electrode of the ninth transistor T9 is electrically connected to the first level terminal V1, and a second electrode of the ninth transistor T9 is electrically connected to the output signal terminal OUTPUT.

As shown in FIG. 2, the output circuit 202 may comprise a tenth transistor T10, an eleventh transistor T11, and a second capacitor C2. A control electrode of the tenth transistor T10 is electrically connected to the pull-up node PU, a first electrode of the tenth transistor T10 is electrically connected to a clock signal terminal CLK, and a second electrode of the tenth transistor T10 is electrically connected to the output signal terminal OUTPUT. A control electrode of the eleventh transistor T11 is electrically connected to the pull-up node PU, a first electrode of the eleventh transistor T11 is electrically connected to the clock signal terminal CLK, and a second electrode of the eleventh transistor T11 is electrically connected to the second output signal terminal OC. A first terminal of the second capacitor C2 is electrically connected to the pull-up node PU, and a second terminal of the second capacitor C2 is electrically connected to the output signal terminal OUTPUT.

As shown in FIG. 2, the input circuit 201 may comprise a twelfth transistor T12. For example, a reset circuit 203 according to the embodiment of the present disclosure may comprise a thirteenth transistor T13.

It should be understood that the circuit structure shown in FIG. 2 is merely an example, and in other embodiments of the present disclosure, the shift register unit may have other circuit structures. For example, in other embodiments, the second output signal terminal OC, the eighth transistor T8, and the eleventh transistor T11 may not be provided.

Figure 3:
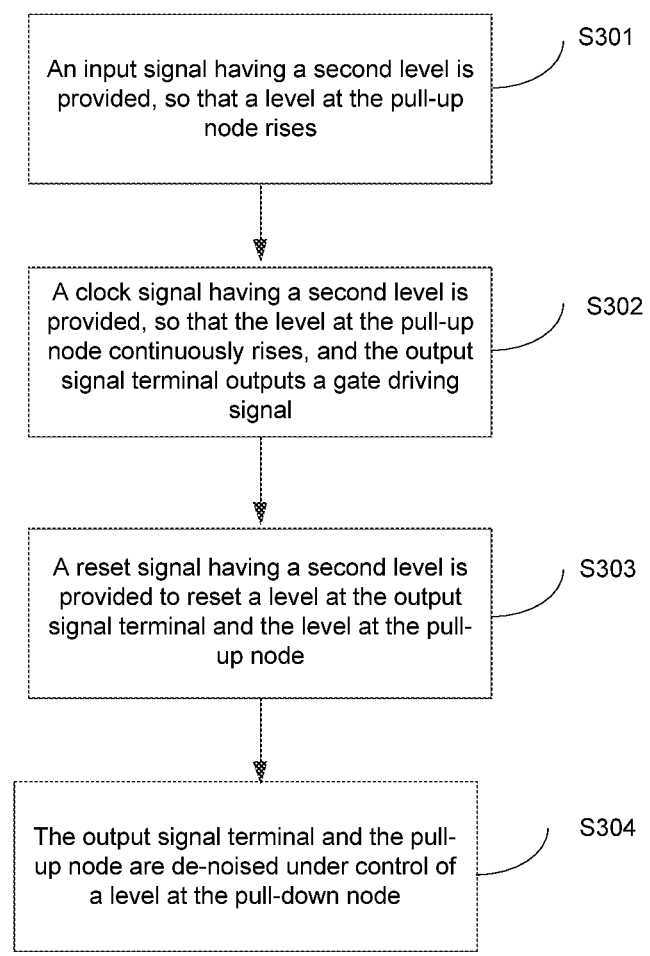
FIG. 3 illustrates a flowchart of a method for driving a shift register unit according to an embodiment of the present disclosure.

According to another aspect of the embodiments of the present disclosure, there is provided a method for driving a shift register unit, which may be applied to the shift register unit according to the embodiment of the present disclosure. It should be illustrated that serial numbers of various steps in the following method are only as a representation of the steps for convenience of the description, and should not be regarded as indicating an execution order of the respective steps. This method does not need to be performed exactly in an order as shown, unless explicitly stated. FIG. 3 illustrates a flowchart of a method for driving a shift register unit according to an embodiment of the present disclosure. As shown in FIG. 3, the method 30 for driving a shift register unit according to the embodiment of the present disclosure may comprise the following steps.

In step S301, an input signal having a high level is provided, so that a level at the pull-up node rises.

In step S302, a clock signal having a high level is provided, so that the level at the pull-up node continuously rises, and the output signal terminal of the shift register unit outputs a gate driving signal.

In step S303, a reset signal having a high level is provided to reset a level at the output signal terminal and the level at the pull-up node.

In step S304, the output signal terminal and the pull-up node are de-noised under control of a level at the pull-down node.

According to an embodiment of the present disclosure, the method further comprises: compensating for, in a touch period, the level at the pull-up node using a compensation signal under control of the level at the pull-up node. In some embodiments, the compensation signal has the high level.

In some embodiments, the touch period is after the first period and before the second period. In some other embodiments, the touch period is after the second period and before the third period.

Figure 4A:
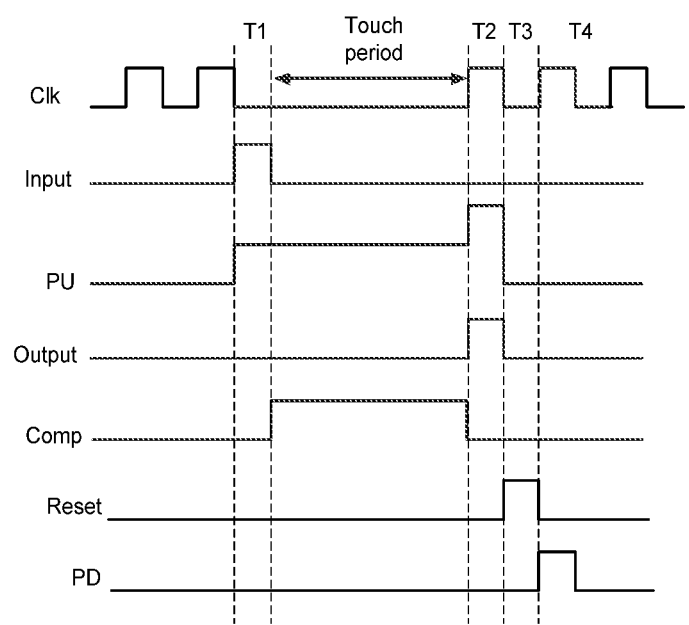
FIG. 4A illustrates an exemplary operational timing diagram of a shift register unit according to an embodiment of the present disclosure.
Figure 4B:
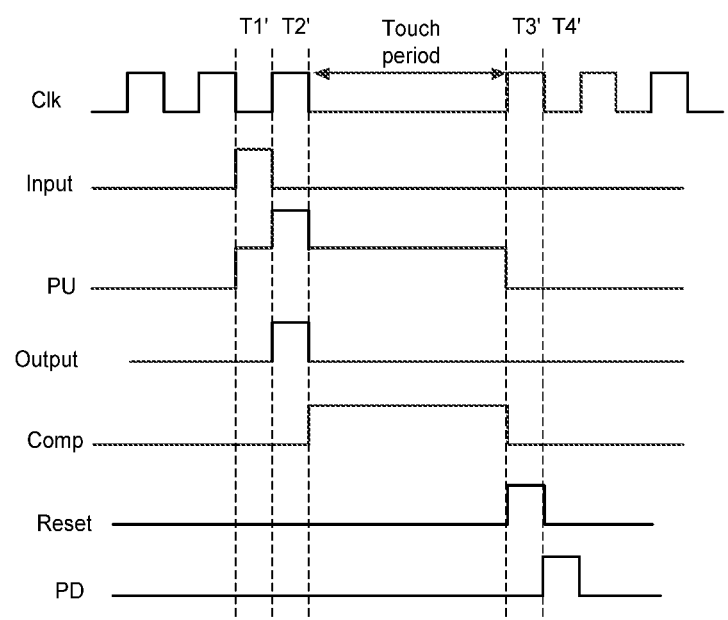
FIG. 4B illustrates another exemplary operational timing diagram of a shift register unit according to an embodiment of the present disclosure.

FIG. 4A illustrates an exemplary operational timing diagram of a shift register unit according to an embodiment of the present disclosure. FIG. 4B illustrates another exemplary operational timing diagram of a shift register unit according to an embodiment of the present disclosure. An operation of the shift register unit according to the embodiment of the present disclosure will be described in detail next with reference to FIGS. 2, 3, 4A, and 4B. For convenience of description, in the following example, description is made by taking all switching transistors being N-type transistors, the first level being a low level, and the second level being a high level as an example.

FIG. 4A illustrates an exemplary operational timing diagram of a shift register unit according to an embodiment of the present disclosure. As shown in FIG. 4A, in a period T1, an input signal Input is at a high level, the twelfth transistor T12 is turned on, and a level at the pull-up node PU starts to rise to charge the second capacitor C2. Since the pull-up node PU is at a high level, the fifth transistor T5 and the sixth transistor T6 are turned on, so that a low level voltage signal V1 is transmitted to the node PDCN and the pull-down node PD through the fifth transistor T5 and the sixth transistor T6 respectively. At the same time, since the pull-up node PU is at a high level, the tenth transistor T10 and the eleventh transistor T11 are turned on, so that a clock signal at the clock signal terminal CLK is transmitted to the output signal terminal OUTPUT. Since the clock signal is at a low level at this time, output signals Oc and Output at the second output signal terminal OC and the output signal terminal OUTPUT are also at a low level. At this time, since the input level Input is at a high level, the input level Input not only pre-charges the pull-up node PU, but also pre-charges the first capacitor C1. Therefore, a level at point A in FIG. 2 coincides with the level at the pull-up node PU.

In the example of FIG. 4A, the period T1 is followed by a touch period. In the touch period, a compensation signal COMP is at a high level. Since the compensation signal COMP changes from a low level to a high level, under the effect of self-parasitic capacitance of the first transistor T1, the level at the point A is bootstrapped to a higher level, and the first transistor T1 is turned on more fully. The second transistor T2 is turned on, so that the level at the pull-up node PU may be better compensated. In the touch period, since the pull-up node PU is at a high level, the fifth transistor T5 and the sixth transistor T6 are turned on, so that the node PDCN and the pull-down node PD are both at a low level. The eighth transistor T8 and the ninth transistor T9 are turned off. Although the tenth transistor T10 and the eleventh transistor T11 are turned on, since the clock signal Clk is continuously at a low level, the output signals Oc and Output at the second output signal terminal OC and the output signal terminal OUTPUT are at a low level.

Then, in a period T2, the compensation signal becomes a low level. The clock signal at the clock signal terminal CLK is at a high level, and the fifth transistor T5 and the sixth transistor T6 are continuously turned on under action of the pull-up node PU, so that the clock signal is transmitted to the output signal terminal OUTPUT and the second output signal terminal OC. At this time, the output signals at the output signal terminal OUTPUT and the second output signal terminal OC are at a high level. Due to the bootstrap action of the second capacitor C2, the level at the pull-up node PU is bootstrapped to a higher level.

In a period T3, the compensation signal Comp and the clock signal Clk are at a low level. A reset signal Reset at the reset signal terminal RESET becomes a high level. The thirteenth transistor T13 is turned on to reset the pull-up node PU to a low level.

In a period T4, the compensation signal Comp, the reset signal Reset, and the input signal Input are all at a low level. Since the control signal Cont is at a high level, the third transistor T3 is turned on, so that the node PDCN is at a high level, and then the fourth transistor T4 is turned on. Since the fourth transistor T4 is turned on, the pull-down node PD becomes a high level, so that the seventh transistor T7, the eighth transistor T8, and the ninth transistor T9 are turned on. Thereby, the low level voltage signal V1 is transmitted to the pull-up node PU, the second output signal terminal OC, and the output signal terminal OUTPUT through the seventh transistor T7, the eighth transistor T8 and the ninth transistor T9 respectively, to continuously de-noise the pull-up node PU, the second output signal terminal OC, and the output signal terminal OUTPUT. That is, the signal at the pull-up node PU and the output signals at the second output signal terminal OC and the output signal terminal OUTPUT are all at a low level.

FIG. 4B illustrates an exemplary operational timing diagram of a shift register unit according to an embodiment of the present disclosure. As shown in FIG. 4B, in a period T1', an input signal Input is at a high level, the twelfth transistor T12 is turned on, and a level at the pull-up node PU starts to rise to charge the second capacitor C2. Since the pull-up node PU is at a high level, the fifth transistor T5 and the sixth transistor T6 are turned on, so that a low level voltage signal V1 is transmitted to the node PDCN and the pull-down node PD through the fifth transistor T5 and the sixth transistor T6 respectively. At the same time, since the pull-up node PU is at a high level, the tenth transistor T10 and the eleventh transistor T11 are turned on, so that a clock signal at the clock signal terminal CLK is transmitted to the output signal terminal OUTPUT. Since the clock signal is at a low level at this time, output signals Oc and Output at the second output signal terminal OC and the output signal terminal OUTPUT are also at a low level. At this time, since the input level Input is at a high level, the input level Input not only pre-charges the pull-up node PU, but also pre-charges the first capacitor C1. Therefore, a level at point A in FIG. 2 coincides with the level at the pull-up node PU.

Then, in a period T2', the clock signal at the clock signal terminal CLK is at a high level. The level at the pull-up node PU is bootstrapped to a higher level due to the bootstrap action of the second capacitor C2. Under the action of the pull-up node PU, the fifth transistor T5 and the sixth transistor T6 are continuously turned on, so that the clock signal is transmitted to the output signal terminal OUTPUT and the second output signal terminal OC. At this time, the output signals at the output signal terminal OUTPUT and the second output signal terminal OC are at a high level.

Unlike the example shown in FIG. 4A, in the example of FIG. 4B, the period T2' is followed by a touch period. In the touch period, a compensation signal COMP is at a high level. Since the compensation signal COMP changes from a low level to a high level, under the effect of self-parasitic capacitance of the first transistor T1, the level at the point A is bootstrapped to a higher level, and the first transistor T1 is turned on more fully. The second transistor T2 is turned on, so that the level at the pull-up node PU may be better compensated. In the touch period, since the pull-up node PU is at a high level, the fifth transistor T5 and the sixth transistor T6 are turned on, so that the node PDCN and the pull-down node PD are both at a low level. The eighth transistor T8 and the ninth transistor T9 are turned off. Although the tenth transistor T10 and the eleventh transistor T11 are turned on, since the clock signal Clk is continuously at a low level, the output signals Oc and Output at the second output signal terminal OC and the output signal terminal OUTPUT are at a low level.

In a period T3', the compensation signal Comp is at a low level, and the clock signal Clk is at a high level. A reset signal Reset at the reset signal terminal RESET becomes a high level. Although the clock signal Clk is at a high level, since the thirteenth transistor T13 is turned on to reset the pull-up node PU to a low level, the tenth transistor T10 and the eleventh transistor T11 are turned off. Thereby, the output signals Oc and Output at the second output signal terminal OC and the output signal terminal OUTPUT are at a low level.

In a period T4', the compensation signal Comp, the reset signal Reset, and the input signal Input are all at a low level. Since the control signal Cont is at a high level, the third transistor T3 is turned on, so that the node PDCN is at a high level, and then the fourth transistor T4 is turned on. Since the fourth transistor T4 is turned on, the pull-down node PD becomes a high level, so that the seventh transistor T7, the eighth transistor T8, and the ninth transistor T9 are turned on. Thereby, the low level voltage signal V1 is transmitted to the pull-up node PU, the second output signal terminal OC, and the output signal terminal OUTPUT through the seventh transistor T7, the eighth transistor T8 and the ninth transistor T9 respectively, to continuously de-noise the pull-up node PU, the second output signal terminal OC, and the output signal terminal OUTPUT. That is, the signal at the pull-up node PU and the output signals at the second output signal terminal OC and the output signal terminal OUTPUT are all at a low level.

Figure 5:
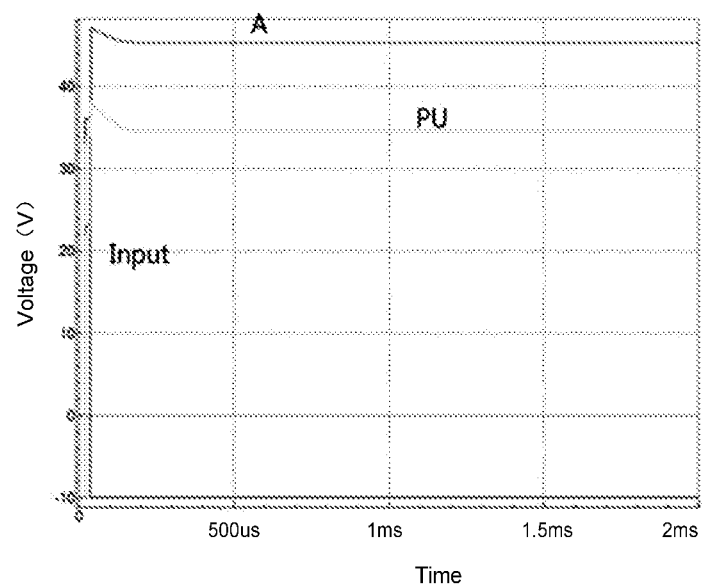
FIG. 5 illustrates a schematic waveform diagram of signal levels in a touch period according to an embodiment of the present disclosure.

FIG. 5 illustrates a schematic waveform diagram of signal levels in a touch period according to an embodiment of the present disclosure. As shown in FIG. 5, in the shift register unit according to the embodiment of the present disclosure, even if the touch period is as long as 2 ms, the level at the pull-up node PU may be kept stable in this period.

According to the technical solution of the embodiments of the present disclosure, the level at the pull-up node PU may be compensated using with the simple circuit structure in the touch period. By adding the first transistor T1, the second transistor T2 and the first capacitor C1 in the shift register unit, when the pull-up node PU and the compensation signal Comp are at a high level at the same time, the high level at the pull-up node PU is compensated using the compensation signal Comp through the first transistor T1 and the second transistor T2, thereby ensuring uniformity between display pictures before and after the touch period and improving product reliability. Since the compensation is performed during display of one frame of picture, and the high level at the compensation signal Comp and the pull-up node PU has a small duty ratio, in a period where the compensation signal Comp and the pull-up node PU are at a high level, stress to the first transistor T1 and the second transistor T2 when the first transistor T1 and the second transistor T2 are turned on has little effect on operational characteristics (for example, threshold voltages) of the transistors. In addition, since the first transistor T1 and the second transistor T2 are added in a shift register unit for each scanning row, touch scanning may be performed at any time during one frame of scanning, and a frequency of the touch scanning may be arbitrarily adjusted. In addition, when level at the pull-up node PU is compensated, the first transistor T1 and the second transistor T2 are both in a turn-on state, and therefore leakage current of the transistors is increased by at least two or three orders of magnitude as compared with leakage current of the transistors in a turn-off state. As a result, the first transistor T1 and the second transistor T2 may have a very small size. Thus, even if two transistors are added in each shift register unit, a size of a bezel of the product may not be significantly affected.

Figure 6:
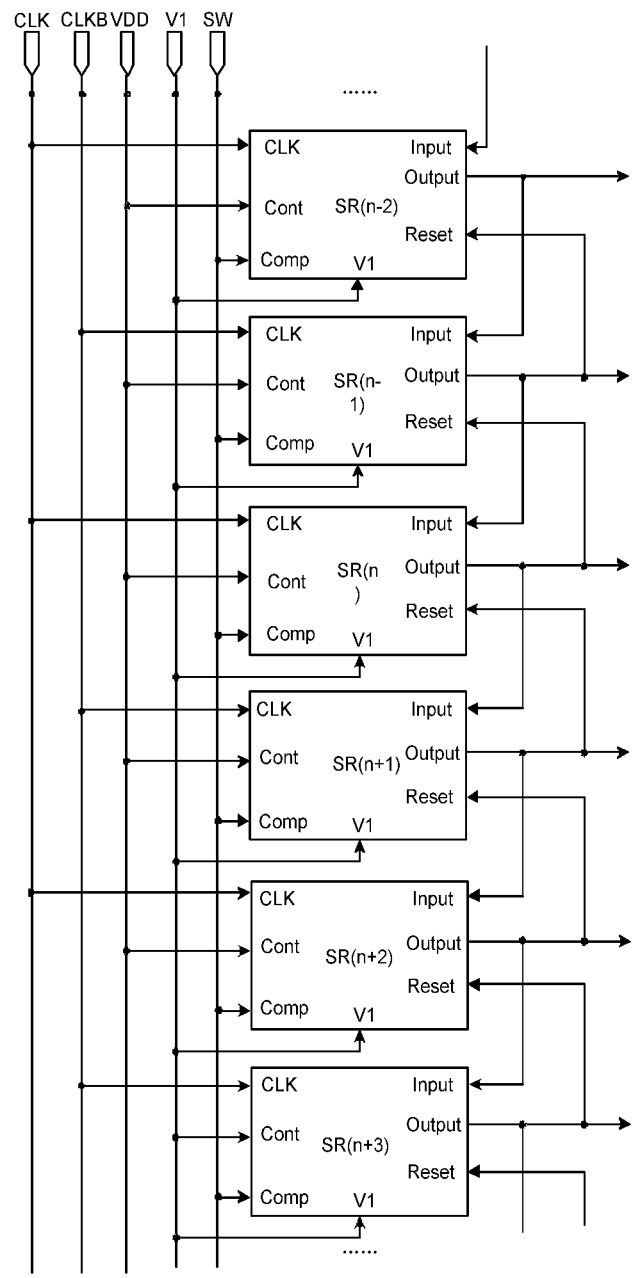
FIG. 6 illustrates an exemplary cascading manner of shift register units in a gate driving circuit according to an embodiment of the present disclosure.

According to an embodiment of the present disclosure, there is further provided a gate driving circuit comprising a compensation signal line SW and N stages of cascaded shift register units according to the embodiment of the present disclosure. FIG. 6 illustrates an exemplary gate driving circuit 60 according to an embodiment of the present disclosure. Two clock signals CLK and CLKB having opposite waveforms are used in the example of FIG. 6. It can be understood by those skilled in the art that the shift register unit in the example of FIG. 6 may not have the second output signal terminal OC for the sake of brevity. By taking an $n^{th}$ stage of shift register unit SR(n) as an example, an output signal terminal OUTPUT of the $n^{th}$ stage of shift register unit SR(n) is electrically connected to an input signal terminal INPUT of an $(n+1)^{th}$ stage of shift register unit SR(n+1) and a reset signal terminal RESET of an $(n-1)^{th}$ stage of shift register unit SR(n-1). The compensation signal line SW is electrically connected to a compensation signal terminal of each shift register unit in the gate driving circuit 60.

It can be understood by those skilled in the art that although the second output signal Oc is not shown in the example of FIG. 6, since the output signal Output and the second output signal OC have the same signal waveform, a second output signal Oc of the $n^{th}$ stage of shift register SR(n) may be electrically connected to the input signal terminal INPUT of the $(n+1)^{th}$ stage of shift register SR(n+1) and the reset signal terminal RESET of the $(n-1)^{th}$ stage of shift register SR(n-1), and an output signal Output(n) of the $n^{th}$ stage of shift register SR(n) is used only as an output gate driving signal of this stage of shift register unit, which is not limited in the embodiments of the present disclosure.

Further, it can be understood by those skilled in the art that when the $(n-1)^{th}$ stage of shift register unit is not present, an input signal terminal of the $n^{th}$ stage of shift register unit may be electrically connected to, for example, a frame Start Vertical (STV) signal.

Figure 7A:
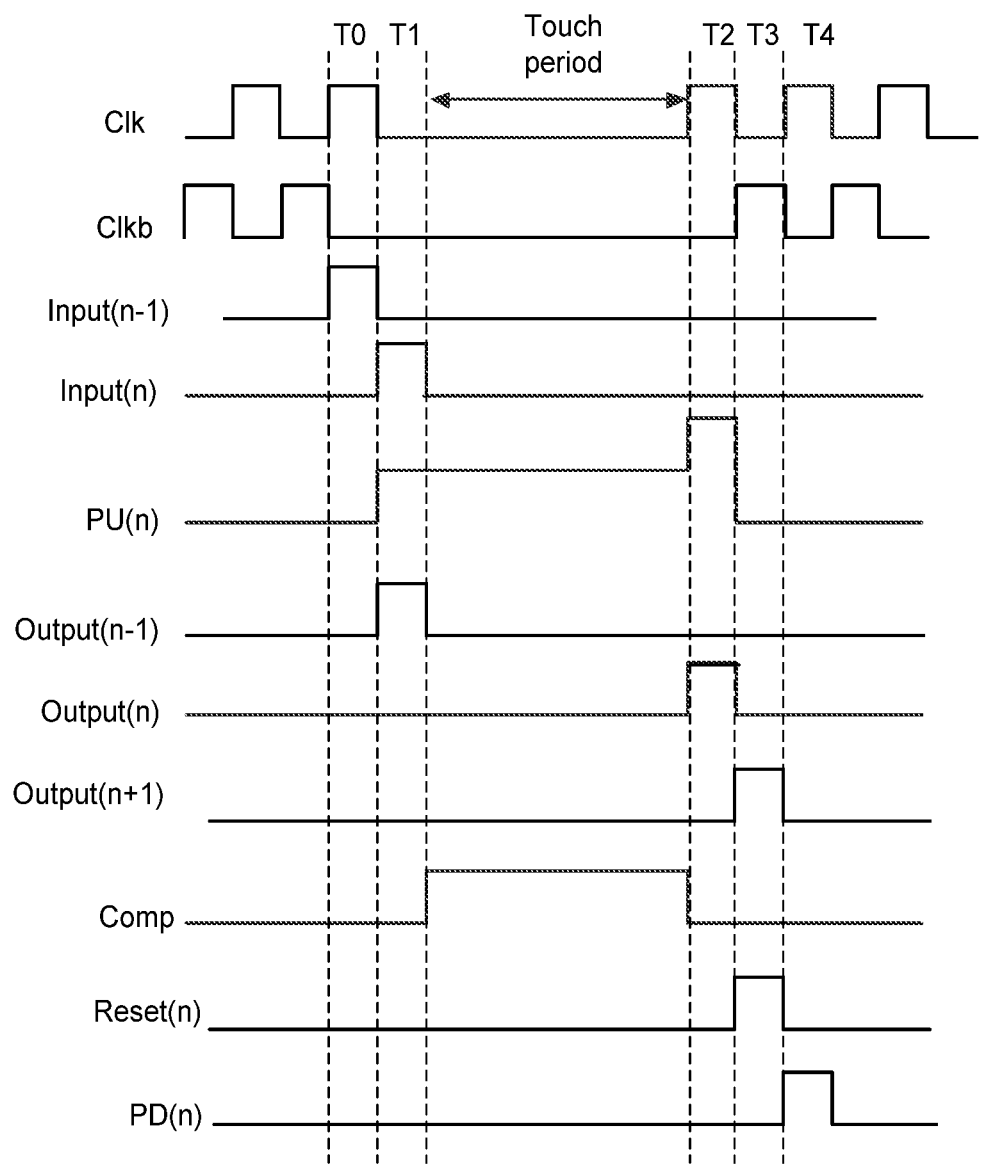
FIG. 7A illustrates an exemplary signal timing diagram of a shift register unit in a gate driving circuit according to an embodiment of the present disclosure.
Figure 7B:
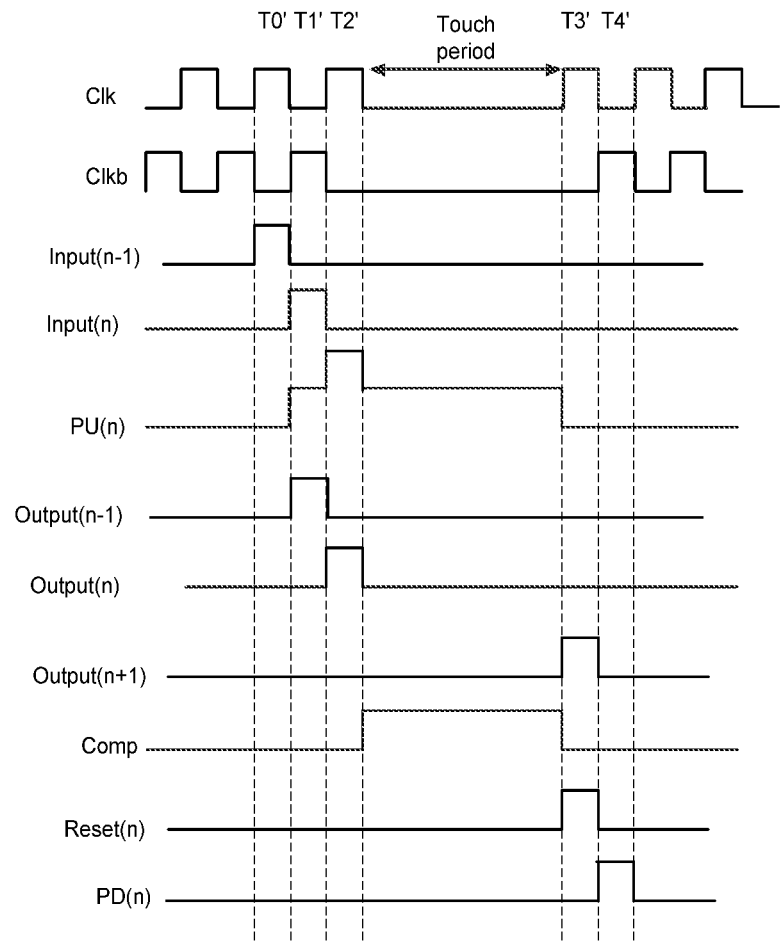
FIG. 7B illustrates an exemplary signal timing diagram of a shift register unit in a gate driving circuit according to an embodiment of the present disclosure.

FIG. 7A illustrates an exemplary signal timing diagram of a shift register unit in a gate driving circuit according to an embodiment of the present disclosure, and FIG. 7B illustrates another exemplary signal timing diagram of a shift register unit in a gate driving circuit according to an embodiment of the present disclosure.

It can be understood by those skilled in the art that an $n^{th}$ stage of shift register unit SR(n) in FIG. 7A may correspond to the shift register unit in FIG. 4A, wherein, for the $n^{th}$ stage of shift register unit SR(n), a control period is immediately after a period T1. As shown in FIG. 7A, an operation of the $n^{th}$ stage of shift register unit SR(n) in periods T1-T4 may refer to the operation of the shift register unit in the periods T1-T4 shown in FIG. 4A, and details thereof will not be not described herein again.

As shown in FIG. 7A, for an $(n-1)^{th}$ stage of shift register unit SR(n-1), in a period T0 in FIG. 7A, an input signal Input(n-1) of the $(n-1)^{th}$ stage of shift register unit SR(n-1) is at a high level, to not only pre-charge a pull-up node PU, but also pre-charge a first capacitor C1. Therefore, a level at point A in FIG. 2 coincides with a level at the pull-up node PU. In a period T1, the $(n-1)^{th}$ stage of shift register unit SR(n-1) outputs a high level signal Output(n-1). In a subsequent touch period, Comp becomes a high level, and since no clock signal is input at a clock signal terminal CLK, an output terminal OUTPUT of the $(n-1)^{th}$ stage of shift register unit SR(n-1) is kept at a low level. It can be understood by those skilled in the art that for the $(n-1)^{th}$ stage of shift register unit SR(n-1), a signal timing shown in FIG. 7A is equivalent to a signal timing in a case where a touch period is added after a period T2 of the shift register unit SR(n-1).

As shown in FIG. 7A, for an $(n+1)^{th}$ stage of shift register unit SR(n+1), in a period T2 in FIG. 7A, an input signal Input(n+1) of the $(n+1)^{th}$ stage of shift register unit SR(n+1) is at a high level (i.e., an output signal Output(n) of the $n^{th}$ stage of shift register unit SR(n) is at a high level), to not only pre-charge a pull-up node PU, but also pre-charge a first capacitor C1. Therefore, a level at point A in FIG. 2 coincides with a level at the pull-up node PU. In a period T3, the $(n+1)^{th}$ stage of shift register unit SR(n+1) outputs a high level signal Output(n+1). Then, the $(n+1)^{th}$ stage of shift register unit SR(n+1) performs a normal operation. It can be understood by those skilled in the art that in the example of FIG. 7A, the addition of the touch period has no substantial effect on the operation of the $(n+1)^{th}$ stage of shift register unit SR(n+1).

It can be understood by those skilled in the art that an $n^{th}$ stage of shift register unit SR(n) in FIG. 7B may correspond to the shift register unit in FIG. 4B, wherein, for the $n^{th}$ stage of shift register unit SR(n), a control period is immediately after a period T2'. As shown in FIG. 7B, an operation of the $n^{th}$ stage of shift register unit SR(n) in periods T1'-T4' may refer to the operation of the shift register unit in the periods T1'-T4' shown in FIG. 4B, and details thereof will not be not described herein again.

As shown in FIG. 7B, for an $(n-1)^{th}$ stage of shift register unit SR(n-1), in a period T0' in FIG. 7B, an input signal Input(n-1) of the $(n-1)^{th}$ stage of shift register unit SR(n-1) is at a high level, to not only pre-charge a pull-up node PU, but also pre-charge a first capacitor C1. Therefore, a level at point A in FIG. 2 coincides with a level at the pull-up node PU. In a period T1', the $(n-1)^{th}$ stage of shift register unit SR(n-1) outputs a high level signal Output(n-1). In a period T2', the $(n-1)^{th}$ stage of shift register unit SR(n-1) is reset using an output signal Output(n) of the $n^{th}$ stage of shift register unit SR(n). In a subsequent touch period, Comp becomes a high level, and an output terminal OUTPUT of the $(n-1)^{th}$ stage of shift register unit SR(n-1) is kept at a low level. In the example of FIG. 7B, the addition of the touch period has no substantial effect on the operation of the $(n-1)^{th}$ stage of shift register unit SR(n-1).

As shown in FIG. 7B, for an $(n+1)^{th}$ stage of shift register unit SR(n+1), in a period T2' in FIG. 7B, an input signal Input(n+1) of the $(n+1)^{th}$ stage of shift register unit SR(n+1) is at a high level (i.e., the output signal Output(n) of the $n^{th}$ stage of shift register unit SR(n) is at a high level), to not only pre-charge a pull-up node PU, but also pre-charge a first capacitor C1. Therefore, a level at point A in FIG. 2 coincides with a level at the pull-up node PU. In a subsequent touch period, a compensation signal COMP is at a high level. A fifth transistor T5 and a sixth transistor T6 in the shift register unit SR(n+1) are turned on, so that a node PDCN and a pull-down node PD are both at a low level. Although a tenth transistor T10 and an eleventh transistor T11 are turned on, since no clock signal is input at a clock signal terminal, an output signal terminal of the shift register unit SR(n+1) is kept at a low level. It can be understood by those skilled in the art that for the $(n+1)^{th}$ stage of shift register unit SR(n+1), a signal timing shown in FIG. 7B is equivalent to a signal timing in a case where a touch period is added after a period T1' of the shift register unit SR(n+1).

Figure 8:
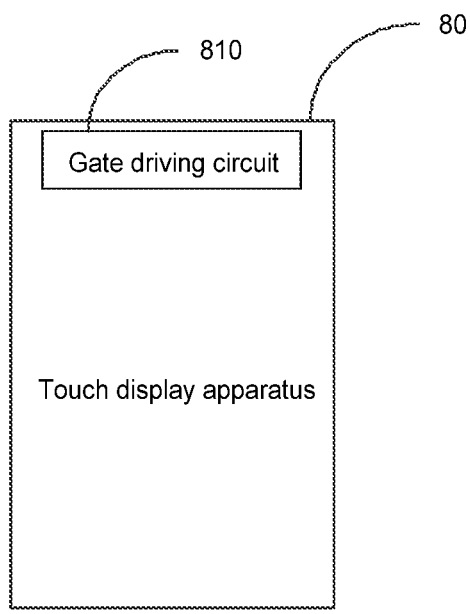
FIG. 8 illustrates a schematic block diagram of a touch display apparatus according to an embodiment of the present disclosure.

FIG. 8 illustrates a schematic block diagram of a touch display apparatus according to an embodiment of the present disclosure. As shown in FIG. 8, the touch display apparatus 80 may comprise a gate driving circuit 810 according to an embodiment of the present disclosure. The touch display apparatus 80 according to the embodiment of the present disclosure may be any product or component having a touch display function, such as an electronic paper, a mobile phone, a tablet computer, a television, a display, a notebook computer, a digital photo frame, a navigator, etc.

The embodiments of the present disclosure provide a shift register unit and a method for driving the same, a gate driving circuit, and a touch display apparatus comprising the gate driving circuit. According to an embodiment of the present disclosure, in the touch display apparatus, the level at the pull-up node of the shift register unit in the touch phase is controlled by, for example, improving the circuit structure of the shift register unit, so that the shift register unit can output a stable gate driving signal.

The specific embodiments described above further illustrate the purposes, technical solutions and beneficial effects of the embodiments of the present disclosure. It is to be understood that the foregoing description is merely specific embodiments of the present disclosure, and is not intended to limit the present disclosure. Any modifications, equivalent substitutions, improvements etc. made within the spirit and principle of the present disclosure shall be included within the protection scope of the present disclosure.

I claim:

1. A shift register unit, comprising:
   an input circuit electrically connected to an input signal terminal and a pull-up node of the shift register unit, and configured to output an input signal received at the input signal terminal to the pull-up node;
   an output circuit electrically connected to an output signal terminal and a clock signal terminal, and configured to output a gate driving signal at the output signal terminal under control of a clock signal received at the clock signal terminal;
   a reset circuit electrically connected to a reset signal terminal, the pull-up node and a first level terminal, and configured to reset the pull-up node to a first level at the first level terminal under control of a reset signal received at the reset signal terminal;
   a pull-down control circuit electrically connected to a control signal terminal, the pull-up node, the first level terminal and the output signal terminal, and configured to control a level at the output signal terminal using the first level at the first level terminal under control of a control signal received at the control signal terminal and a level at the pull-up node; and
   a compensation circuit electrically connected to a compensation signal terminal and the pull-up node, and configured to compensate for the level at the pull-up node using a compensation signal received at the compensation signal terminal under control of the level at the pull-up node, wherein
   the compensation circuit comprises a first transistor, a second transistor, and a first capacitor, wherein:
   a control electrode of the first transistor is electrically connected to a first terminal of the first capacitor, a first electrode of the first transistor is electrically connected to the compensation signal terminal, and a second electrode of the first transistor is electrically connected to a control electrode and a first electrode of the second transistor;
   a second electrode of the second transistor is electrically connected to the pull-up node; and
   a second terminal of the first capacitor is electrically connected to the pull-up node.

2. The shift register unit according to claim 1, wherein the pull-down control circuit comprises a first sub-circuit and a second sub-circuit, wherein:
   the first sub-circuit is electrically connected to the control signal terminal, the pull-up node and a pull-down node, and is configured to control a level at the pull-down node under control of the control signal and the level at the pull-up node; and
   the second sub-circuit is electrically connected to the first level terminal, the pull-down node, and the output signal terminal, and is configured to pull down the level at the output signal terminal using the first level under control of the level at the pull-down node.

3. The shift register unit according to claim 2, wherein the first sub-circuit comprises a third transistor, a fourth transistor, a fifth transistor, and a sixth transistor, wherein:
   a control electrode and a first electrode of the third transistor are commonly electrically connected to the control signal terminal, and a second electrode of the third transistor is electrically connected to a control electrode of the fourth transistor;
   a first electrode of the fourth transistor is electrically connected to the control signal terminal, and a second electrode of the fourth transistor is electrically connected to the pull-down node;
   a control electrode of the fifth transistor is electrically connected to the pull-up node, a first electrode of the fifth transistor is electrically connected to the first level terminal, and a second electrode of the fifth transistor is electrically connected to the control electrode of the fourth transistor; and
   a control electrode of the sixth transistor is electrically connected to the pull-up node, a first electrode of the sixth transistor is electrically connected to the first level terminal, and a second electrode of the sixth transistor is electrically connected to the second electrode of the fourth transistor.

4. The shift register unit according to claim 2, wherein the second sub-circuit comprises a seventh transistor and a ninth transistor, wherein:
   a control electrode of the seventh transistor is electrically connected to the pull-down node, a first electrode of the seventh transistor is electrically connected to the first level terminal, and a second electrode of the seventh transistor is electrically connected to the pull-up node; and
   a control electrode of the ninth transistor is electrically connected to the pull-down node, a first electrode of the ninth transistor is electrically connected to the first level terminal, and a second electrode of the ninth transistor is electrically connected to the output signal terminal.

5. The shift register unit according to claim 4, wherein the second sub-circuit further comprises an eighth transistor, wherein:
   a control electrode of the eighth transistor is electrically connected to the pull-down node, a first electrode of the eighth transistor is electrically connected to the first level terminal, and a second electrode of the eighth transistor is electrically connected to a second output signal terminal.

6. The shift register unit according to claim 1, wherein the output circuit comprises a tenth transistor and a second capacitor, wherein:
   a control electrode of the tenth transistor is electrically connected to the pull-up node, a first electrode of the tenth transistor is electrically connected to the clock signal terminal, and a second electrode of the tenth transistor is electrically connected to the output signal terminal; and a first terminal of the second capacitor is electrically connected to the pull-up node, and a second terminal of the second capacitor is electrically connected to the output signal terminal.

7. The shift register unit according to claim 6, wherein the output circuit further comprises an eleventh transistor, wherein:
a control electrode of the eleventh transistor is electrically connected to the pull-up node, a first electrode of the eleventh transistor is electrically connected to the clock signal terminal, and a second electrode of the eleventh transistor is electrically connected to a second output signal terminal.

8. A gate driving circuit, comprising:
a compensation signal line; and
a plurality of cascaded shift register units according to claim 1,
wherein the compensation signal line is electrically connected to the compensation signal terminal of each of the plurality of shift register units.

9. A touch display apparatus, comprising the gate driving circuit according to claim 8.

10. A method for driving the shift register unit according to claim 1, comprising:
providing, in a first period, an input signal having a second level, so that a level at the pull-up node is raised up;
providing, in a second period, a clock signal having the second level, so that the level at the pull-up node continuously rises, and the output signal terminal of the shift register unit outputs a gate driving signal;
providing, in a third period, a reset signal having the second level to reset a level at the output signal terminal and the level at the pull-up node; and
de-noising, in a fourth period, the output signal terminal and the pull-up node under control of a level at a pull-down node,
wherein the method further comprises: compensating for, in a touch period, the level at the pull-up node using the compensation signal under control of the level at the pull-up node.

11. The method according to claim 10, wherein the compensation signal has the second level.

12. The method according to claim 10, wherein the touch period is after the first period and before the second period.

13. The method according to claim 10, wherein the touch period is after the second period and before the third period.

* * * * *